United States Patent [19]
Parris et al.

[11] Patent Number: 5,892,709
[45] Date of Patent: Apr. 6, 1999

[54] SINGLE LEVEL GATE NONVOLATILE MEMORY DEVICE AND METHOD FOR ACCESSING THE SAME

[75] Inventors: Patrice M. Parris; Yee-Chaung See, both of Phoenix, Ariz.

[73] Assignee: Motorola, Inc., Schaumburg, Ill.

[21] Appl. No.: 853,601

[22] Filed: May 9, 1997

[51] Int. Cl.$^6$ .................................................. G11C 16/04
[52] U.S. Cl. ................ 365/185.01; 365/185.1; 365/185.18; 257/371
[58] Field of Search .......................... 365/185.01, 185.1, 365/185.18; 257/371

[56] References Cited

U.S. PATENT DOCUMENTS

| | | | |
|---|---|---|---|
| 5,027,171 | 6/1991 | Reedy et al. | 357/42 |
| 5,465,231 | 11/1995 | Ohsaki | 365/185.33 |
| 5,587,945 | 12/1996 | Lin et al. | 365/185.1 |
| 5,604,700 | 2/1997 | Parris et al. | 365/185.1 |
| 5,754,471 | 5/1998 | Peng et al. | 365/185.1 |

*Primary Examiner*—Huan Hoang
*Attorney, Agent, or Firm*—Rennie William Dover

[57] ABSTRACT

A single level gate NVM device (10) includes p-channel and n-channel floating gate FETs (12, 14), an erasing capacitor (26), and a programming capacitor (28). The NVM device (10) is programmed by applying a programming voltage to the programming capacitor (28) and applying a ground voltage to the sources of the FETs (12, 14). The NVM device (10) is erased by applying an erasing voltage to the erasing capacitor (26) and applying ground voltage to the sources of the FETs (12, 14) and to the programming capacitor (28). Data is read from the NVM device (10) by sensing a voltage level at the drains of the FETs (12, 14) while applying a logic high voltage to the source of the p-channel FET (12), a logic low voltage to the source of the n-channel FET (14), and a reading voltage to the programming capacitor (28).

20 Claims, 4 Drawing Sheets

SINGLE LEVEL GATE NONVOLATILE MEMORY DEVICE AND METHOD FOR ACCESSING THE SAME

BACKGROUND OF THE INVENTION

The present invention relates, in general, to memory devices and, more particularly, to nonvolatile memory devices.

Electrically Erasable Programmable Read Only Memory (EEPROM) permits storing data that can be retained even if power to the memory is removed. An EEPROM cell stores data by storing electrical charge in an electrically isolated floating gate of a field effect transistor (FET). The stored electrical charge controls the threshold of the FET, thereby controlling the memory state of the EEPROM cell.

Two common structures for an EEPROM cell are a double poly structure and a single poly structure. The double poly structure is conventionally fabricated using two polycrystalline silicon layers. The single poly structure requires only one polycrystalline silicon layer and, therefore, is simpler and less expensive to fabricate than the double poly structure. However, the single poly structure usually requires more silicon area than the double poly structure.

To read data from the EEPROM cell, a sense amplifier is conventionally used to sense a current flowing in the FET, thereby determining the memory state of the EEPROM cell. However, the sense amplifier increases the circuit complexity, silicon area, and fabrication cost of the EEPROM cell. In addition, the sense amplifier consumes a large current during the process of reading data from the EEPROM cell and, therefore, is power inefficient.

Accordingly, it would be advantageous to have a nonvolatile memory device and a method for accessing the nonvolatile memory device. It is desirable for the nonvolatile memory device to be simple and inexpensive to fabricate. It is also desirable for the accessing method to be energy efficient. It would be of further advantage for the nonvolatile memory device to be reliable.

BRIEF DESCRIPTION OF THE DRAWINGS

It should be noted that the same reference numerals are used in the figures to represent elements of similar structure and function.

DETAILED DESCRIPTION OF THE DRAWINGS

Generally, the present invention provides a nonvolatile memory (NVM) device and a method for accessing the NVM device. The NVM device includes two floating gate transistors coupled to each other like a pull-up transistor and a pull-down transistor in an inverter. The NVM device also includes an erasing capacitor and a programming capacitor coupled to the floating gate. In accordance with the present invention, the breakdown voltages of the transistors impose fewer limitations on the voltages applied to the NVM cell during the programming and erasing processes than those in prior art single level gate NVM cells. During the process of reading data from the NVM device, only one of the pull-up and pull-down transistors in the NVM device is dominantly conductive depending on the charge stored in the floating gate. The voltage at the output terminal of the inverter is either pulled up to a logic high voltage level, which represents a first logic value, e.g., a logic one, or pulled down to a logic low voltage level, which represents a second logic value, e.g., a logic zero. Thus, the data is read from the NVM device without using a sense amplifier.

Figure 1:
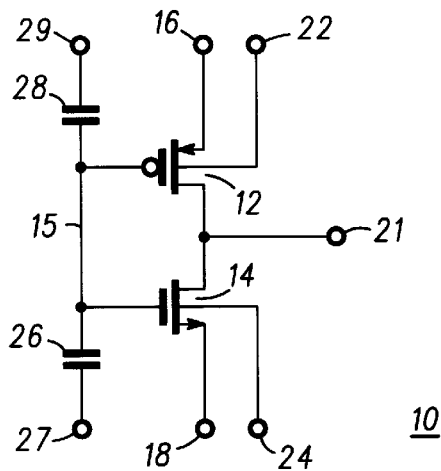
FIGS. 1 and 2 illustrate a memory device in accordance with a first embodiment of the present invention.

FIG. 1 is a schematic diagram of a single level gate nonvolatile memory device, e.g., an NVM cell 10, in accordance with a first embodiment of the present invention. NVM cell 10 includes two floating gate transistors 12 and 14 having their floating gates connected to each other. More particularly, transistor 12 is a p-channel insulated gate field effect transistor (FET) and transistor 14 is an n-channel insulated gate FET. FETs 12 and 14 share a floating gate 15. A source electrode of FET 12 and a source electrode of FET 14 serve as a first source terminal 16 and a second source terminal 18, respectively, of NVM cell 10. A drain electrode of FET 12 and a drain electrode of FET 14 are coupled together, forming an output terminal 21 of NVM cell 10. A substrate electrode of FET 12 and a substrate electrode of FET 14 serve as a first substrate terminal 22 and a second substrate terminal 24, respectively, of NVM cell 10. NVM cell 10 also includes an erasing capacitor 26 having a first electrode connected to floating gate 15 and a second electrode serving as an erasing terminal 27 of NVM cell 10. In addition, NVM cell 10 includes a programming capacitor 28 having a first electrode connected to floating gate 15 and a second electrode serving as a programming terminal 29 of NVM cell 10.

Erasing capacitor 26 and programming capacitor 28 minimize the probability of FETs 12 and 14 breaking down during the processes of erasing and programming NVM cell 10. Preferably, a capacitance of erasing capacitor 26 is smaller than both a gate capacitance of FET 12 and a gate capacitance of FET 14. Further, a capacitance of programming capacitor 28 is preferably larger than the sum of the gate capacitance of FET 12, the gate capacitance of FET 14, and the capacitance of erasing capacitor 26. It should be noted that programming capacitor 28 is optional in NVM cell 10. It should also be noted that FETs 12 and 14 can be replaced by other types of transistors, e.g., insulated gate bipolar transistors, high electron mobility transistors (HEMTs), and the like. As those skilled in the art are aware, the source and drain electrodes of a FET serve as current conducting electrodes of a transistor.

Figure 2:
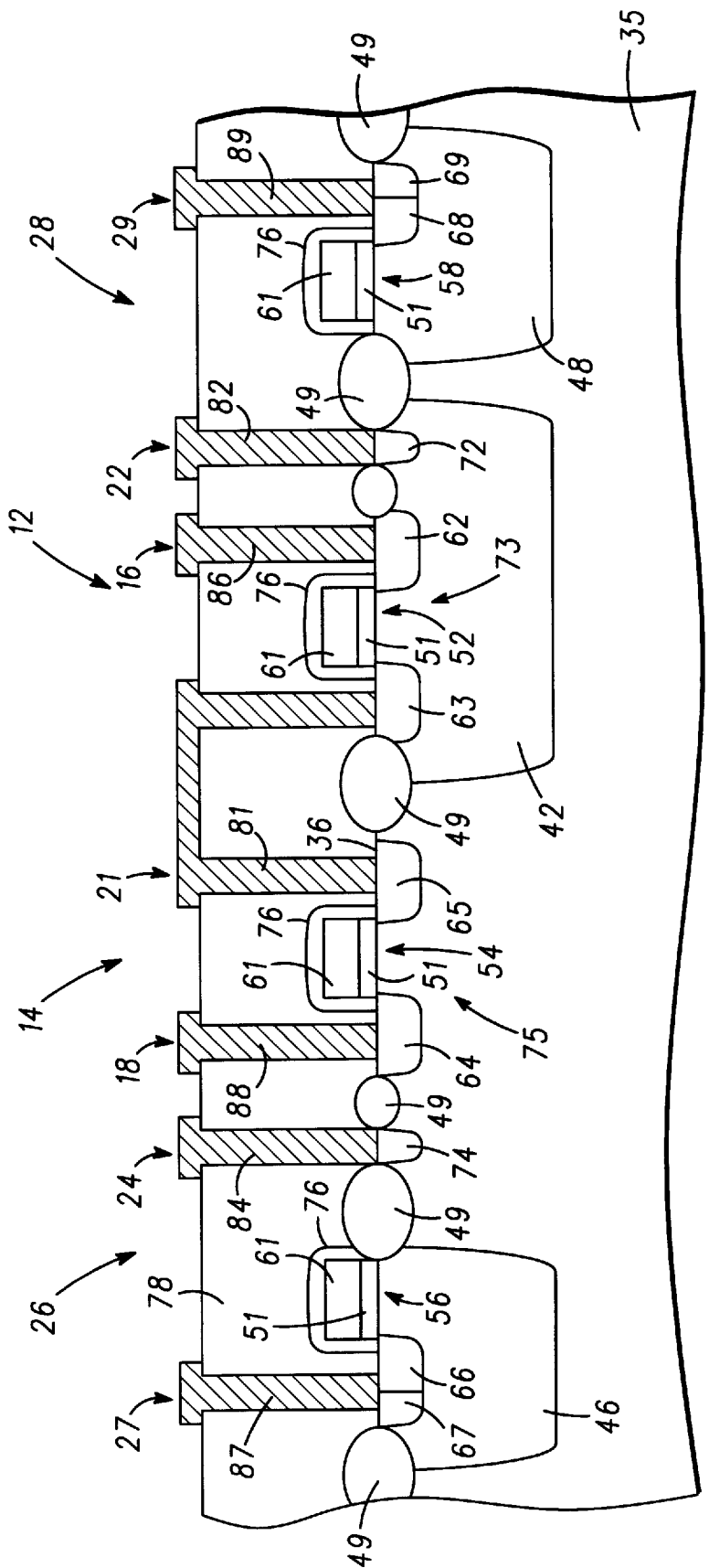

FIG. 2 is a cross-sectional view of NVM cell 10 schematically shown in FIG. 1. NVM cell 10 is fabricated using a body of semiconductor material. By way of example, the body of semiconductor material is a silicon substrate 35 of p conductivity type having a major surface 36. Substrate 35 has an initial dopant concentration between, for example, approximately $1 \times 10^{12}$ atoms per cubic centimeter (atoms/$cm^3$) and approximately $1 \times 10^{16}$ atoms/$cm^3$ near major surface 36. Wells 42, 46, and 48 of n conductivity type are formed in substrate 35. Isolation structures such as, for example, field oxide regions 49 are formed on substrate 35 using techniques well known to those skilled in the art. Preferably, an ion implantation is performed before forming field oxide regions 49 to form doped regions (not shown) under field oxide regions 49. The doped regions (not shown) prevent inadvertent turning on of parasitic FETs formed under field oxide regions 49.

A dielectric layer such as, for example, a silicon dioxide layer 51 having a thickness between approximately 5 nanometers (nm) and approximately 50 nm is disposed on major surface 36 of substrate 35. Dielectric layer 51 is patterned into four portions that are separated from each other. The first portion of dielectric layer 51 overlies well 42 and serves as a gate dielectric layer 52 of FET 12. The second portion of dielectric layer 51 serves as a gate dielectric layer 54 of FET 14. The third portion of dielectric layer 51 overlies well 46 and serves as a dielectric layer 56 of erasing capacitor 26. The fourth portion of dielectric layer 51 overlies well 48 and serves as a dielectric layer 58 of programming capacitor 28.

A conductive layer 61 is deposited on dielectric layer 51 and patterned to overlie gate dielectric layer 52 of FET 12, gate dielectric layer 54 of FET 14, dielectric layer 56 of erasing capacitor 26, and dielectric layer 58 of programming capacitor 28. By way of example, conductive layer 61 is a polycrystalline silicon layer having a thickness between approximately 150 nm and approximately 500 nm. The portions of polycrystalline silicon layer 61 that overlie gate dielectric layers 52 and 54, and dielectric layers 56 and 58 are connected together and form floating gate 15 (shown in FIG. 1) of FETs 12 and 14 and the first electrodes of erasing capacitor 26 and programming capacitor 28. It should be noted that the connections that couple different portions of conductive layer 61 together are not shown in FIG. 2. Preferably, polycrystalline silicon layer 61 is doped either during the deposition process or in a subsequent doping step.

Gate dielectric layer 52 and the portion of conductive layer 61 thereon form a gate structure of FET 12. Gate dielectric layer 54 and the portion of conductive layer 61 thereon form a gate structure of FET 14. Dielectric layer 56, the portion of conductive layer 61 thereon, and well 46 cooperate to form erasing capacitor 26, wherein well 46 serves as a conductor of erasing capacitor 26. Dielectric layer 58, the portion of conductive layer 61 thereon, and well 48 cooperate to form programming capacitor 28, wherein well 48 serves as a conductor of programming capacitor 28.

An insulating layer 76 is formed over conductive layer 61 and on the sidewalls of conductive layer 61 and dielectric layer 51. Insulating layer 76 is preferably patterned to cap the gate structure of FET 12, the gate structure of FET 14, erasing capacitor 26, and programming capacitor 28. Further, insulating layer 76 preferably caps the connections which electrically couple different portions of conductive layer 61 together. Insulating layer 76 can be an oxide-nitride stack comprised of a silicon nitride layer on top of a silicon dioxide layer, an oxide-nitride-oxide stack comprised of a silicon nitride layer between a top silicon dioxide layer and a bottom silicon dioxide layer, a silicon oxynitride layer, or the like. During the operation of NVM cell 10, insulating layer 76 minimizes the charge leakage from floating gate 15 (shown in FIG. 1), thereby improving the data retention rate and the reliability of NVM cell 10. Although preferred, it should be understood that insulating layer 76 is an optional feature in NVM cell 10.

Ions of p conductivity type, e.g., boron or boron fluoride ions, are implanted into substrate 35 to form a source region 62 and a drain region 63 of p-channel FET 12, and a substrate contact region 74 of FET 14. The ion implantation process also forms a p conductivity type doped region 66 in well 46 adjacent dielectric layer 56 and a p conductivity type doped region 68 in well 48 adjacent dielectric layer 58. Source region 62 and drain region 63 define a channel region 73 therebetween and under gate dielectric layer 52. In other words, channel region 73 of FET 12 separates source region 62 from drain region 63. By way of example, source region 62 and drain region 63 have a dopant concentration between approximately $1 \times 10^{15}$ atoms/cm$^3$ and approximately $5 \times 10^{22}$ atoms/cm$^3$.

Ions of n conductivity type, e.g., phosphorus or arsenic ions, are implanted into substrate 35 to form a source region 64 and a drain region 65 of n-channel FET 14, and a substrate contact region 72 of FET 12. The ion implantation process also forms an n conductivity type doped region 67 in well 46 adjacent p conductivity type doped region 66 and an n conductivity type doped region 69 in well 48 adjacent p conductivity type doped region 68. Source region 64 and drain region 65 define a channel region 75 therebetween and under gate dielectric layer 54. In other words, channel region 75 of FET 14 separates source region 64 from drain region 65. By way of example, source region 64 and drain region 65 have a dopant concentration between approximately $1 \times 10^{15}$ atoms/cm$^3$ and approximately $5 \times 10^{22}$ atoms/cm$^3$. Doped region 66 of p conductivity type and doped region 67 of n conductivity type form a contact region of erasing capacitor 26. Likewise, doped region 68 of p conductivity type and doped region 69 of n conductivity type form a contact region of programming capacitor 28.

An insulating layer 78 is disposed over substrate 35 and planarized. By way of example, insulating layer 78 is silicon dioxide and has a thickness ranging from approximately 300 nm to approximately 1500 nm. Insulating layer 78 provides electrical isolation between NVM cell 10 and other devices (not shown) that may be fabricated on substrate 35. Metallization regions are formed in insulating layer 78 to form the electrodes of NVM cell 10. A metallization region 81 is connected to drain region 63 of FET 12 and drain region 65 of FET 14 and serves as output terminal 21 of NVM cell 10. A metallization region 82 is connected to substrate contact region 72 of FET 12 and serves as first substrate terminal 22 of NVM cell 10. A metallization region 84 is connected to substrate contact region 74 of FET 14 and serves as second substrate terminal 24 of NVM cell 10. A metallization region 86 is connected to source region 62 of FET 12 and serves as first source terminal 16 of NVM cell 10. A metallization region 88 is connected to source region 64 of FET 14 and serves as second source terminal 18 of NVM cell 10. A metallization region 87 is connected to the contact region formed by doped regions 66 and 67 in well 46 and serves as erasing terminal 27 of NVM cell 10. A metallization region 89 is connected to the contact region formed by doped regions 68 and 69 in well 48 and serves as programming terminal 29 of NVM cell 10.

As described herein with reference to FIG. 2, NVM cell 10 includes a single conductive layer 61. Thus, NVM cell 10 is also referred to as a single level gate nonvolatile memory cell or a single poly nonvolatile memory cell. NVM cell 10 can be fabricated using complementary metal oxide semiconductor (CMOS) technologies well known in the art.

It should be understood that the structure and the fabrication process of NVM cell 10 are not limited to those described hereinbefore with reference to FIG. 2. For example, gate dielectric layers 52 and 54 and dielectric layers 56 and 58 are not limited to being patterned from a single dielectric layer 51. They can be formed in different dielectric layer growth, deposition, and/or patterning processes. Thus, the thickness of each of gate dielectric layers 52 and 54 and dielectric layers 56 and 58 can be individually adjusted to optimize the performance of NVM cell 10. In addition, the portions of conductive layer 61 over gate dielectric layers 52 and 54 and dielectric layers 56 and 58 can be separated from each other and electrically coupled to each other via metallization regions (not shown) formed in insulating layer 78.

To electrically program NVM cell 10, source terminals 16 and 18, substrate terminals 22 and 24, and erasing terminal 27 are coupled to a reference voltage level such as, for example, a ground voltage level. Output terminal 21 is isolated from an applied voltage level. In other words, output terminal 21 is left floating. A programming voltage between, for example, approximately 10 volts (V) and approximately 20 V is applied to programming terminal 29. The programming voltage depends on the thickness of dielectric layer 51. Usually, a thick dielectric layer 51 requires a high programming voltage for the programming process to be efficient.

The programming voltage is capacitively divided between programming capacitor 28 and an equivalent capacitor that includes a parallel combination of the gate capacitor of FET 12, the gate capacitor of FET 14, and erasing capacitor 26. Because of their respective capacitance values, a larger portion of the programming voltage is across gate dielectric layer 52 of FET 12, gate dielectric layer 54 of FET 14, and dielectric layer 56 of erasing capacitor 26 than across dielectric layer 58 of programming capacitor 28. Charge carriers, e.g., electrons, under gate dielectric layers 52 and 54 of FETs 12 and 14, respectively, and under dielectric layer 56 of erasing capacitor 26 are attracted by the high voltage at floating gate 15. In a Fowler-Nordheim tunneling process, the charge carriers are injected across gate dielectric layer 52, gate dielectric layer 54, and dielectric layer 56 into the corresponding portions of conductive layer 61. Floating gate 15 becomes negatively charged. After the programming voltages are removed from NVM cell 10, the injected carriers remain in conductive layer 61 and floating gate 15 remains negatively charged. Therefore, a first logic value, e.g., a logic one, is stored in NVM cell 10, i.e., NVM cell 10 is programmed.

In an alternative embodiment of the present invention, NVM cell 10 is programmed by coupling source terminals 16 and 18 and substrate terminals 22 and 24 to a reference voltage level such as, for example, ground voltage level. Output terminal 21 is isolated from an applied voltage level. The programming voltage is applied to both programming terminal 29 and erasing terminal 27. In this embodiment, the programming voltage is capacitively divided between two equivalent capacitors. The first equivalent capacitor includes programming capacitor 28 and erasing capacitor 26 coupled in a parallel combination, and the second equivalent capacitor includes the gate capacitor of FET 12 and the gate capacitor of FET 14 coupled in a parallel combination. Charge carriers are injected into floating gate 15 through gate dielectric layers 52 and 54 of FETs 12 and 14, respectively.

During the programming process, the drains of FETs 12 and 14 are left floating, and the sources and substrates of FETs 12 and 14 are connected to the same voltage level. Thus, the probability of FETs 12 and 14 breaking down during the programming process is minimized, and the breakdown voltages of FETs 12 and 14 no longer impose a limitation on the programming voltage applied to NVM cell 10. This allows a higher programming voltage, thicker gate dielectric layers 52 and 54, and/or smaller FETs 12 and 14 than prior art single poly floating gate nonvolatile memory devices. A high programming voltage increases the time efficiency of the programming process. A thick gate dielectric layer improves the reliability of NVM cell 10. In addition, the process of fabricating FETs 12 and 14 with thick gate dielectric layers is readily compatible with existing CMOS fabrication processes and easily implemented in new processes with scaled down devices. Small FETs 12 and 14 increase the silicon area efficiency of NVM cell 10.

It should be understood that NVM cell 10 is not limited to being programmed via a tunneling process. For example, NVM cell 10 can also be programmed via a hot carrier injection process. In an embodiment for programming NVM cell 10 via the hot carrier injection process, source terminal 16, substrate terminals 22 and 24, and output terminal 21 are connected to a reference voltage such as, for example, ground voltage, the programming voltage is applied to programming terminal 29, and a source voltage between, for example, approximately 1 V and approximately 10 V is applied to source terminal 18. Erasing terminal 27 can be connected to the programming voltage, connected to the reference voltage, or left floating. Preferably, the source voltage is higher than the reference voltage applied to output terminal 21. During the programming process, source region 64 functions as a drain of FET 14 and drain region 65 functions as a source of FET 14, i.e., FET 14 operates in a reverse mode. Charge carriers, e.g., electrons, originating from drain region 65 are accelerated in channel region 75 under floating gate 15 and injected into floating gate 15 adjacent source region 64 in a hot carrier injection process.

To electrically erase NVM cell 10, source terminals 16 and 18, substrate terminals 22 and 24, and programming terminal 29 are coupled to a reference voltage level such as, for example, ground voltage level. Output terminal 21 is isolated from an applied voltage level. In other words, output terminal 21 is left floating. An erasing voltage between, for example, approximately 10 V and approximately 20 V is applied to erasing terminal 27.

The erasing voltage is capacitively divided between erasing capacitor 26 and an equivalent capacitor that includes a parallel combination of the gate capacitor of FET 12, the gate capacitor of FET 14, and programming capacitor 28. Because of their respective capacitance values, a larger portion of the erasing voltage is across dielectric layer 56 of erasing capacitor 26 than across gate dielectric layer 52 of FET 12, gate dielectric layer 54 of FET 14, and dielectric layer 58 of programming capacitor 28. Charge carriers, e.g., electrons, on floating gate 15 are attracted by the high voltage at erasing terminal 27. In a Fowler-Nordheim tunneling process, the charge carriers are injected across dielectric layer 56 of erasing capacitor 26 into well 46. Preferably, the erasing process continues until floating gate 15 becomes substantially neutral or positively charged. After the erasing voltages are removed from NVM cell 10, floating gate 15 remains substantially neutral or positively charged. A second logic value, e.g., a logic zero, is stored in NVM cell 10, i.e., NVM cell 10 is erased.

During the erasing process, the drains of FETs 12 and 14 are left floating, and the sources and substrates of FETs 12 and 14 are coupled to the same voltage level. Thus, FETs 12 and 14 do not break down during the erasing process, and the breakdown voltages of FETs 12 and 14 no longer impose a limitation on the erasing voltage applied to NVM cell 10. This allows a higher erasing voltage, thicker gate dielectric layers 52 and 54, and/or smaller FETs 12 and 14 than prior art single poly floating gate nonvolatile memory devices. A high erasing voltage increases the time efficiency of the erasing process.

To read data from NVM cell 10, source terminal 16 and substrate terminal 22 are coupled to a logic high voltage level such as, for example, a supply voltage level $V_{DD}$. By way of example, the supply voltage level $V_{DD}$ ranges from approximately 0.9 V to approximately 5 V. Source terminal 18 and substrate terminal 24 are coupled to a logic low voltage level such as, for example, ground voltage level. A reading voltage between, for example, approximately −5 V and +5 V is applied to programming terminal 29. Erasing terminal 27 can be connected to the reading voltage, connected to ground, or left floating. Because floating gate 15 is capacitively coupled to source terminals 16 and 18, substrate terminals 22 and 24, erasing terminal 27, and programming terminal 29, the voltages applied to these terminals and the electric charge stored in floating gate 15 determine the voltage level of floating gate 15.

If NVM cell 10 has been programmed, floating gate 15 is negatively charged, and the effective threshold voltages of FETs 12 and 14 are higher than their respective intrinsic threshold voltages when floating gate 15 is substantially neutral. In other words, the effective threshold voltages of FETs 12 and 14 are more positive or less negative than their respective intrinsic threshold voltages when NVM cell 10 has been programmed. If NVM cell 10 has been erased, floating gate 15 is substantially neutral or positively charged, and the effective threshold voltages of FETs 12 and 14 are substantially equal to or lower than their respective intrinsic threshold voltages. Preferably, NVM cell 10 is biased during the reading process so that the voltage level of floating gate 15 is lower than the effective threshold voltages of FETs 12 and 14 if NVM cell 10 has been programmed. Further, the voltage level of floating gate 15 is preferably higher than the effective threshold voltages of FETs 12 and 14 if NVM cell 10 has been erased. Therefore, when reading data from a programmed NVM cell 10, p-channel FET 12 is conductive and n-channel FET 14 is nonconductive. The voltage level at output terminal 21 is pulled up substantially to the logic high voltage level at source terminal 16, which represents the first logic value, e.g., logic one. On the other hand, when reading data from an erased NVM cell 10, p-channel FET 12 is nonconductive and n-channel FET 14 is conductive. The voltage level at output terminal 21 is pulled down substantially to the logic low voltage level at source terminal 18, which represents the second logic value, e.g., logic zero.

During the reading process, the voltage level at output terminal 21 is either pulled up to the logic high voltage level if NVM cell 10 has been programmed or pulled down to the logic low voltage level if NVM cell 10 has been erased. Accordingly, a sense amplifier is not needed to read data from NVM cell 10. Compared with a memory device which includes a sense amplifier, NVM cell 10 is simple, easy to fabricate, and silicon area efficient. In addition, NVM cell 10 operates like a CMOS inverter, i.e., only one of FETs 12 and 14 is conductive, during the reading process. If output terminal 29 of NVM cell 10 is connected to a capacitive load, e.g., the gate of an insulated gate FET, the direct current (DC) consumption of NVM cell 10 is substantially zero during the reading process. Thus, NVM cell 10 is power efficient and suitable for low power applications.

Figure 3:
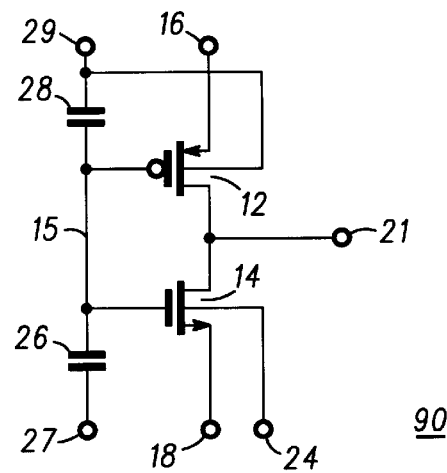
FIGS. 3 and 4 illustrate a memory device in accordance with a second embodiment of the present invention.

FIG. 3 is a schematic diagram of a memory device, e.g., an NVM cell 90, in accordance with a second embodiment of the present invention. Like NVM cell 10 shown in FIG. 1, NVM cell 90 includes p-channel floating gate FET 12, n-channel floating gate FET 14, erasing capacitor 26, and programming capacitor 28. The structure of NVM cell 90 is similar to that of NVM cell 10 shown in FIG. 1. A difference between NVM cell 90 and NVM cell 10 is that the second electrode of programming capacitor 28 is connected to the substrate electrode of FET 12 in NVM cell 90. Therefore, NVM cell 90 does not have a substrate terminal that is both connected to the substrate electrode of FET 12 and separated from the second electrode of programming capacitor 28, like substrate terminal 22 in NVM cell 10 shown in FIG. 1.

Figure 4:
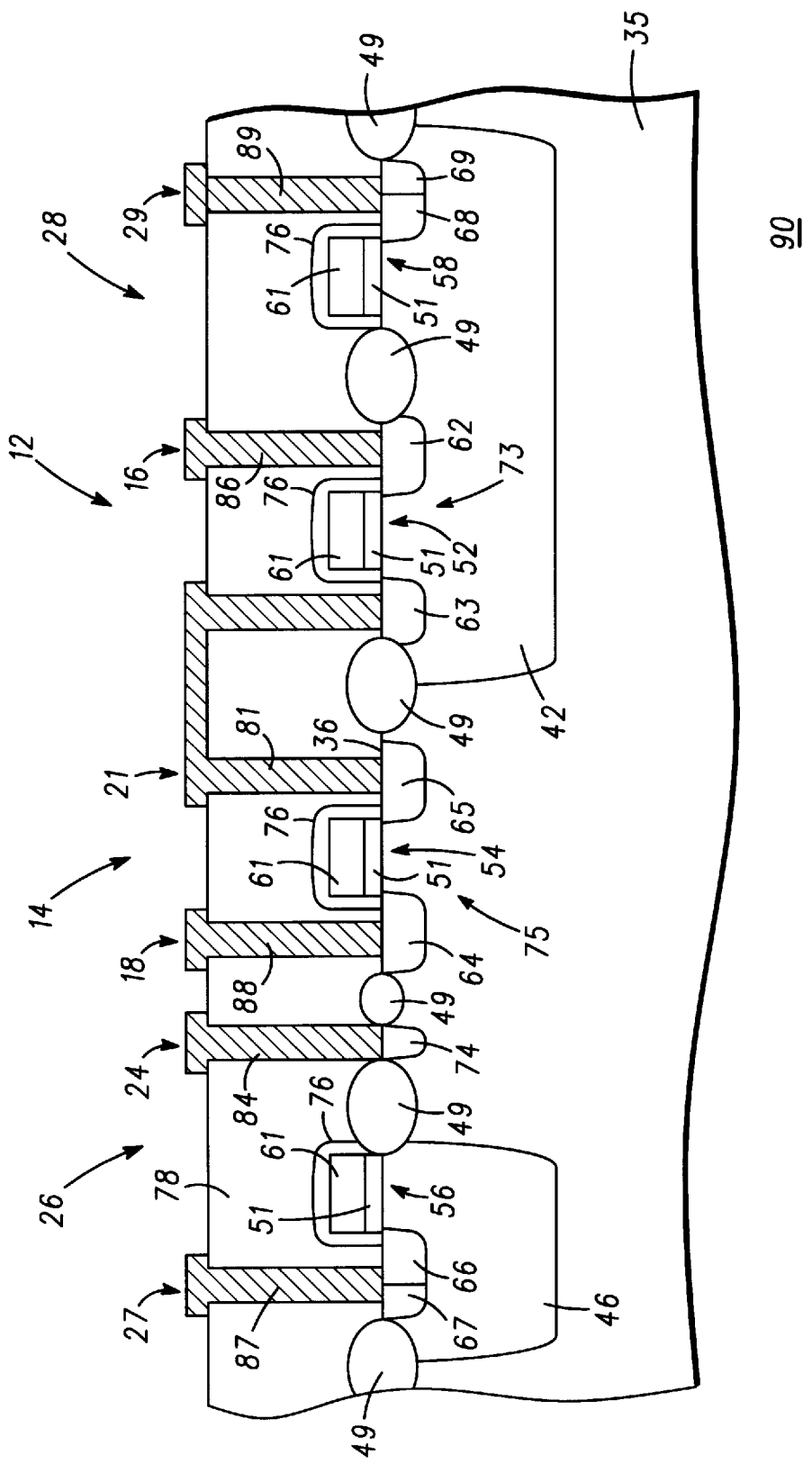

FIG. 4 is a cross-sectional view of NVM cell 90 schematically shown in FIG. 3. Like NVM cell 10 shown in FIG. 2, NVM cell 90 is fabricated on a body of semiconductor material such as, for example, silicon substrate 35. The structure of NVM cell 90 is similar to that of NVM cell 10 shown in FIG. 2. A difference between the structures of NVM cell 90 and NVM cell 10 is that, in NVM cell 90, programming capacitor 28 is formed in the same well, i.e., well 42, as p-channel FET 12. Therefore, NVM cell 90 includes two wells of n conductivity type, i.e., wells 42 and 46. By forming FET 12 and programming capacitor 28 in the same well, the silicon area of NVM cell 90 is reduced compared with that of NVM cell 10 shown in FIG. 2. However, better isolation between FET 12 and programming capacitor 28 is provided by forming them in different wells.

As shown in FIG. 4, NVM cell 90 includes a single conductive layer 61. Thus, NVM cell 90 is also referred to as a single level gate nonvolatile memory cell or a single poly nonvolatile memory cell. NVM cell 90 can be fabricated using CMOS technologies well known in the art.

The processes of programming, erasing, and reading NVM cell 90 are similar to those of programming, erasing, and reading, respectively, NVM cell 10. In an embodiment for programming NVM cell 90 via a tunneling process, the programming voltage is applied to programming terminal 29. Therefore, the substrate of FET 12 is also connected to the programming voltage when programming NVM cell 90. In an alternative embodiment for programming NVM cell 90, the programming voltage is applied to both programming terminal 29 and erasing terminal 27. In another alternative embodiment for programming NVM cell 90, the programming voltage is applied to both programming terminal 29 and source terminal 16. In yet another alternative embodiment for programming NVM cell 90, the programming voltage is applied to programming terminal 29, erasing terminal 27, and source terminal 16. Like NVM cell 10 shown in FIGS. 1 and 2, NVM cell 90 can also be programmed via a hot carrier process by operating FET 14 in a reverse mode.

Figure 5:
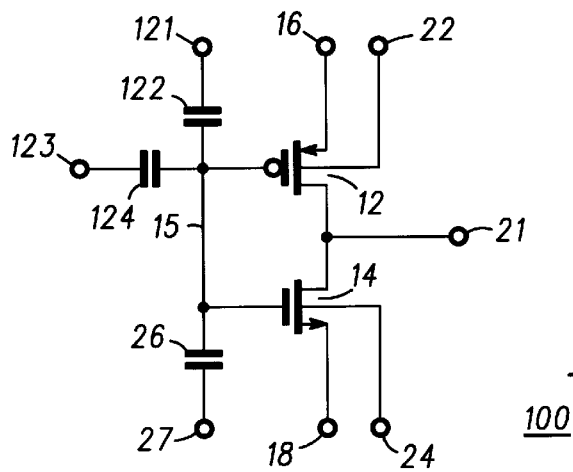
FIGS. 5 and 6 illustrate a memory device in accordance with a third embodiment of the present invention.

FIG. 5 is a schematic diagram of a memory device, e.g., an NVM cell 100, in accordance with a third embodiment of the present invention. Like NVM cell 10 shown in FIG. 1, NVM cell 100 includes p-channel floating gate FET 12, n-channel floating gate FET 14, and erasing capacitor 26. NVM cell 100 further includes two programming capacitors 122 and 124. A first electrode of programming capacitor 122 and a first electrode of programming capacitor 124 are connected to floating gate 15. A second electrode of programming capacitor 122 serves as a row programming terminal 121 of NVM cell 100. A second electrode of programming capacitor 124 serves as a column programming terminal 123 of NVM cell 100. Programming capacitors 122 and 124 perform a function similar to that of programming capacitor 28 in NVM cell 10 shown in FIG. 1. Preferably, the capacitance values of programming capacitors 122 and 124 are significantly larger than the sum of the gate capacitance of FET 12, the gate capacitance of FET 14, and the capacitance of erasing capacitor 26. Further, they are preferably substantially equal to each other.

Figure 6:
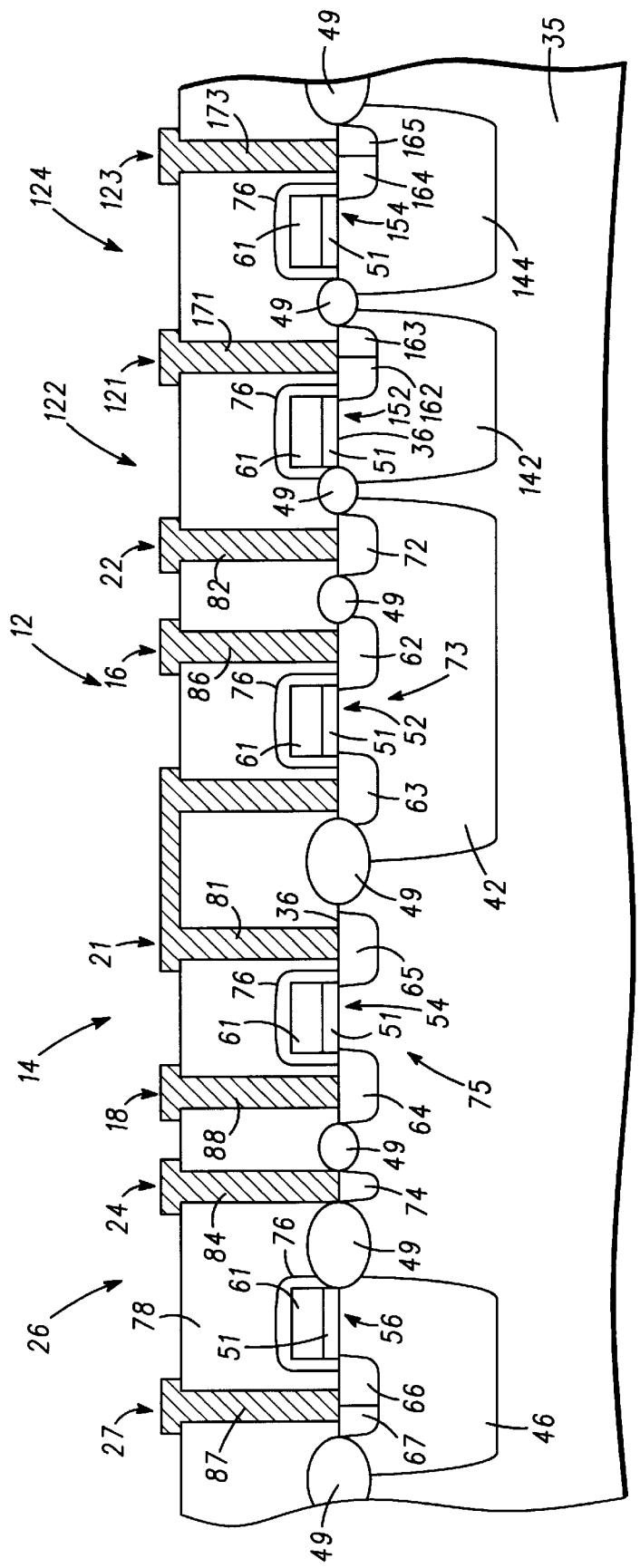

FIG. 6 is a cross-sectional view of NVM cell 100 schematically shown in FIG. 5. Like NVM cell 10 shown in FIG. 2, NVM cell 100 is fabricated on a body of semiconductor material such as, for example, silicon substrate 35. The structure of NVM cell 100 is similar to that of NVM cell 10 shown in FIG. 2. A difference between the structures of NVM cell 100 and NVM cell 10 is that NVM cell 100 has two programming capacitors 122 and 124 fabricated in two wells 142 and 144 of n conductivity type. Programming capacitor 122 has a dielectric layer 152 on major surface 36 overlying well 142. A doped region 162 of p conductivity type and a doped region 163 of n conductivity type form a contact region of programming capacitor 122. Programming capacitor 124 has a dielectric layer 154 on major surface 36 overlying well 144. A doped region 164 of p conductivity type and a doped region 165 of n conductivity type form a contact region of programming capacitor 124. In one embodiment, dielectric layers 152 and 154 are formed from dielectric layer 51 using the same process step in which gate dielectric layers 52 and 54 of FETs 12 and 14, respectively, are formed. In another embodiment, dielectric layers 152 and 154 are formed using a different dielectric layer (not shown) from dielectric layer 51. Doped regions 162 and 164 of p conductivity type are preferably formed using the same process step as source region 62 and drain region 63 of FET 12. Similarly, doped regions 163 and 165 of n conductivity type are preferably formed using the same process step as source region 64 and drain region 65 of FET 14. Conductive layer 61, which forms floating gate 15 (shown in FIG. 5) for FETs 12 and 14, also overlies dielectric layers 152 and 154. Preferably, insulating layer 76 also caps both a structure of programming capacitor 122 formed by dielectric layer 152 and a portion of conductive layer 61 thereon and a structure of programming capacitor 124 formed by dielectric layer 154 and a portion of conductive layer 61 thereon. A metallization region 171 in insulating layer 78 electrically couples the contact region in well 142 and serves as the second electrode of programming capacitor 122. Metallization region 171 is coupled to row programming terminal 121. A metallization region 173 in insulating layer 78 electrically couples the contact region in well 144 and serves as the second electrode of programming capacitor 124. Metallization region 173 is coupled to column programming terminal 123.

As shown in FIG. 6, NVM cell 100 includes a single conductive layer 61. Thus, NVM cell 100 is also referred to as a single level gate nonvolatile memory cell or a single poly nonvolatile memory cell. NVM cell 100 can be fabricated using CMOS technologies well known in the art. The processes of erasing and reading NVM cell 100 are similar to the processes of erasing and reading, respectively, NVM cell 10 of FIGS. 1 and 2 as described hereinbefore. The process of programming NVM cell 100 is implemented using a mechanism referred to as a half-select mechanism as described hereinafter.

Figure 7:
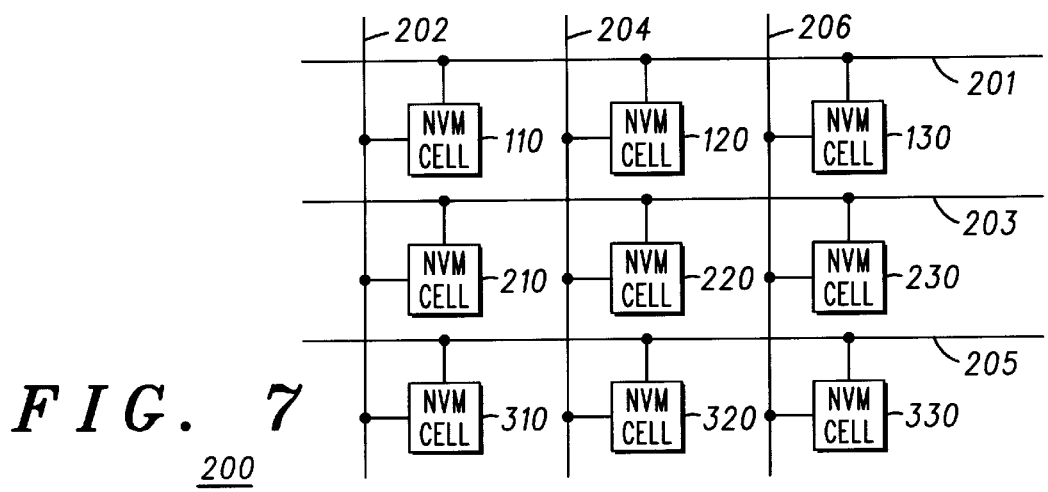
FIG. 7 is a block diagram of a memory device in accordance with a fourth embodiment of the present invention.

FIG. 7 is a block diagram of an NVM device 200 in accordance with a fourth embodiment of the present invention. NVM device 200 includes an array of NVM cells arranged in rows and columns. Preferably, the NVM cells in NVM device 200 are structurally identical to NVM cell 100 shown in FIGS. 5 and 6. FIG. 7 shows NVM device 200 having nine NVM cells arranged in three rows and three columns. However, this is not a limitation of the present invention. In accordance with the present invention, NVM device 200 may include an array of NVM cells arranged in any number of rows and any number of columns.

The NVM cells in NVM device 200 are addressed by their positions, e.g., their row numbers and column numbers, in the array. In the first row, NVM cells 110, 120, and 130 are positioned in the first, second, and third columns, respectively. In the second row, NVM cells 210, 220, and 230 are positioned in the first, second, and third columns, respectively. In the third row, NVM cells 310, 320, and 330 are positioned in the first, second, and third columns, respectively.

NVM device 200 is programmed through row programming lines 201, 203, and 205, and column programming lines 202, 204, and 206. Row programming line 201 is connected to the row programming terminals of NVM cells 110, 120, and 130 in the first row. Row programming line 203 is connected to the row programming terminals of NVM cells 210, 220, and 230 in the second row. Row programming line 205 is connected to the row programming terminals of NVM cells 310, 320, and 330 in the third row. Column programming line 202 is connected to the column programming terminals of NVM cells 110, 210, and 310 in the first column. Column programming line 204 is connected to the column programming terminals of NVM cells 120, 220, and 320 in the second column. Column programming line 206 is connected to the column programming terminals of NVM cells 130, 230, and 330 in the third column.

To electrically program a memory cell, e.g., NVM cell 220, in the array, row programming lines 201 and 205 and column programming lines 202 and 206 are coupled to a reference voltage level, e.g., ground voltage level. The erasing terminal, the substrate terminals, and the source terminals of each NVM cell in the array are also coupled to ground. The programming voltage is applied to row programming line 203 and to column programming line 204.

During the programming process, the row programming terminals and the column programming terminals of NVM cells 110, 130, 310, and 330 are at ground voltage level. Therefore, NVM cells 110, 130, 310, and 330 do not participate in the process of programming NVM cell 220.

NVM cells 210 and 230, which are in the same row as NVM cell 220, have their row programming terminals at the programming voltage level and their column programming terminals at ground voltage level. In each of NVM cells 210 and 230, the programming voltage is capacitively divided between programming capacitor 122 (shown in FIG. 5) and a equivalent capacitor that includes a parallel combination of programming capacitor 124, the gate capacitor of FET 12, the gate capacitor of FET 14, and erasing capacitor 26 (shown in FIG. 5). Because of their respective capacitance values, the voltages across gate dielectric layer 52 of FET 12, gate dielectric layer 54 of FET 14, and dielectric layer 56 of erasing capacitor 26 (shown in FIG. 6) are substantially lower than the programming voltage. For example, the voltage across gate dielectric layer 52 of FET 12, gate dielectric layer 54 of FET 14, and dielectric layer 56 of erasing capacitor 26 (shown in FIG. 6) may be substantially equal to one half of the programming voltage. Preferably, this voltage is sufficiently low so that significant tunneling does not occur. Therefore, NVM cells 210 and 230 do not participate in the process of programming NVM cell 220 in NVM device 200.

NVM cells 120 and 320, which are in the same column as NVM cell 220, have their row programming terminals at ground voltage level and their column programming terminals at the programming voltage level. In each of NVM cells 120 and 320, the programming voltage is capacitively divided between programming capacitor 124 (shown in FIG. 5) and an equivalent capacitor that includes a parallel combination of programming capacitor 122, the gate capacitor of FET 12, the gate capacitor of FET 14, and erasing capacitor 26 (shown in FIG. 5). Because of their respective capacitance values, the voltages across gate dielectric layer 52 of FET 12, gate dielectric layer 54 of FET 14, and dielectric layer 56 of erasing capacitor 26 (shown in FIG. 6) are substantially lower than the programming voltage. For example, the voltage across gate dielectric layer 52 of FET 12, gate dielectric layer 54 of FET 14, and dielectric layer 56 of erasing capacitor 26 (shown in FIG. 6) may be substantially equal to one half of the programming voltage. Preferably, this voltage is sufficiently low so that significant tunneling does not occur. Therefore, NVM cells 120 and 320 do not participate in the process of programming NVM cell 220 in NVM device 200.

In NVM cell 220, the programming voltage is capacitively divided between two equivalent capacitors. The first equivalent capacitor includes programming capacitors 122 and 124 (shown in FIG. 5) coupled in a parallel combination, and the second equivalent capacitor includes the gate capacitor of FET 12, the gate capacitor of FET 14, and erasing capacitor 26 (shown in FIG. 5) coupled in a parallel combination. Because of their respective capacitance values, a larger portion of the programming voltage is across gate dielectric layer 52 of FET 12, gate dielectric layer 54 of FET 14, and dielectric layer 56 of erasing capacitor 26 (shown in FIG. 6) than across dielectric layer 152 of programming capacitor 122 and dielectric layer 154 of programming capacitor 124 (shown in FIG. 6). Charge carriers, e.g., electrons, under gate dielectric layers 52 and 54 of FETs 12 and 14, respectively, and under dielectric layer 56 of erasing capacitor 26 are attracted by the high voltage at floating gate 15. In a Fowler-Nordheim tunneling process, the charge carriers are injected across gate dielectric layer 52, gate dielectric layer 54, and dielectric layer 56 into the corresponding portions of conductive layer 61. Floating gate 15 becomes negatively charged. After the programming voltages are removed from NVM device 200, the injected carriers remain in conductive layer 61 and floating gate 15 remains negatively charged. Therefore, the first logic value, e.g., logic one, is stored in NVM cell 220, i.e., NVM cell 220 is programmed.

It should be understood that an NVM cell in NVM device 200 can also be programmed via a hot carrier injection process. When programming an NVM cell in NVM device 200 via the hot carrier injection process, the n-channel FET in the NVM cell operates in a reverse mode. Like the hot carrier injection process described hereinbefore with reference to NVM cell 10 shown in FIGS. 1 and 2, the carriers, e.g., electrons, are injected from the channel region of the n-channel FET to the floating gate of the NVM cell in NVM device 200.

By now it should be appreciated that an electrically erasable and programmable NVM device and a method for accessing the NVM device have been provided. The NVM device includes two floating gate FETs sharing a common floating gate. The NVM device also includes a programming capacitor and an erasing capacitor coupled to the floating gate. The process of fabricating the NVM device is compatible with existing CMOS fabrication processes and can be easily implemented in new processes with scaled down FETs. The NVM device is programmed or erased by moving charges onto or away from the floating gate. In accordance with the present invention, the breakdown voltages of the FETs impose few limitations on the biasing voltages during the programming and erasing processes. Therefore, the reliability and silicon area efficiency of the NVM device are improved compared with prior art NVM devices. The time efficiency of the programming and erasing processes are also improved. When reading data from the NVM device, the NVM device operates like a CMOS inverter, and the voltage at the output of the inverter is either pulled up to a logic high voltage level or pulled down to a logic low voltage level. Thus, the data is read from the NVM device without using a sense amplifier. Compared with prior art memory devices which include sense amplifiers, the NVM device of the present invention is simple, easy to fabricate, and silicon area efficient. In addition, the NVM device of the present invention is power efficient and suitable for low power applications.

While specific embodiments of the present invention have been shown and described, further modifications and improvements will occur to those skilled in the art. For example, trenches, highly doped sinkers, and/or highly doped buried layers can be used to provide signal isolation between different elements of the NVM device. Further, the NVM device can be fabricated using a semiconductor substrate of n conductivity type. The NVM device can also be fabricated using an epitaxially grown semiconductor layer or a silicon on insulator (SOI) substrate.

We claim:

1. A single level gate nonvolatile memory device, comprising:
   a first floating gate transistor having a floating gate, a first current conducting electrode, and a second current conducting electrode;
   a second floating gate transistor having a floating gate coupled to the floating gate of the first floating gate transistor, a first current conducting electrode, and a second current conducting electrode coupled to the second current conducting electrode of the first floating gate transistor;
   a first programming capacitor having a first electrode coupled to the floating gate of the second floating gate transistor and a second electrode coupled to a first programming terminal;
   a second programming capacitor having a first electrode coupled to the floating gate of the second floating gate transistor and a second electrode coupled to a second programming terminal; and
   an erasing capacitor having an electrode coupled to the floating gate of the first floating gate transistor.

2. The single level gate nonvolatile memory device of claim 1, wherein:
   the first floating gate transistor is an n-channel insulated gate field effect transistor; and
   the second floating gate transistor is a p-channel insulated gate field effect transistor.

3. The single level gate nonvolatile memory device of claim 1, wherein the first programming terminal is coupled for receiving a row programming signal and the second programming terminal is coupled for receiving a column programming signal.

4. The single level gate nonvolatile memory device of claim 1, wherein:
   the first floating gate transistor has a first gate capacitance;
   the second floating gate transistor has a second gate capacitance; and
   a capacitance of the erasing capacitor is smaller than the first gate capacitance and the second gate capacitance.

5. The single level gate nonvolatile memory device of claim 4, wherein a capacitance of the first programming capacitor is larger than a sum of the first gate capacitance, the second gate capacitance, and the capacitance of the erasing capacitor.

6. The single level gate nonvolatile memory device of claim 5, wherein a capacitance of the second programming capacitor is substantially equal to the capacitance of the first programming capacitor.

7. A single level gate nonvolatile memory device, comprising:
   a body of semiconductor material having a major surface;
   a first well of a first conductivity type in the body of semiconductor material;
   a second well of the first conductivity type in the body of semiconductor material;

a first source region of a second conductivity type in the first well;

a first drain region of the second conductivity type in the first well;

a first channel region in the first well and separating the first source region from the first drain region;

a first gate dielectric layer overlying the first channel region;

a second source region of the first conductivity type in a portion of the body of semiconductor material outside the first well and the second well;

a second drain region of the first conductivity type in the portion of the body of semiconductor material and electrically coupled to the first drain region;

a second channel region in the portion of the body of semiconductor material and separating the second source region from the second drain region;

a second gate dielectric layer overlying the second channel region;

a first dielectric layer overlying the second well;

a first contact region in the second well;

a conductive layer over the body of semiconductor material, a first portion of the conductive layer overlying the first gate dielectric layer, a second portion of the conductive layer overlying the second gate dielectric layer and electrically coupled to the first portion of the conductive layer, a third portion of the conductive layer overlying the first dielectric layer and electrically coupled to the first portion of the conductive layer; and wherein the first source region, the first channel region, the first drain region, the first gate dielectric layer, and the first portion of the conductive layer form a first floating gate field effect transistor, the second source region, the second channel region, the second drain region, the second gate dielectric layer, and the second portion of the conductive layer form a second floating gate field effect transistor, and the first contact region, the second well, the first dielectric layer, and the third portion of the conductive layer form an erasing capacitor.

8. The single level gate nonvolatile memory device of claim 7, wherein the first contact region includes:

a first doped region of the second conductivity type adjacent the first dielectric layer; and a second doped region of the first conductivity type adjacent and electrically coupled to the first doped region.

9. The single level gate nonvolatile memory device of claim 7, further comprising an insulating layer on the conductive layer, the insulating layer capping a first structure formed by the first portion of the conductive layer and the first gate dielectric layer, and capping asecond structure formed by the second portion of the conductive layer and the second gate dielectric layer.

10. The single level gate nonvolatile memory device of claim 7, further comprising:

a second dielectric layer overlying a portion of the first well outside the first source region, the first channel region, and the first drain region, wherein a fourth portion of the conductive layer overlies the second dielectric layer and is electrically coupled to the first portion of the conductive layer; and a second contact region in the first well and separated from the first source region, the first channel region, and the first drain region, wherein the second contact region, the first well, the second dielectric layer, and the fourth portion of conductive layer form a programming capacitor.

11. The single level gate nonvolatile memory device of claim 7, further comprising:

a third well of the first conductivity type in the body of semiconductor material;

a second dielectric layer overlying the third well, wherein a fourth portion of the conductive layer overlies the second dielectric layer and is electrically coupled to the first portion of the conductive layer; and a second contact region in the third well, wherein the second contact region, the third well, the second dielectric layer, and the fourth portion of conductive layer form a first programming capacitor.

12. The single level gate nonvolatile memory device of claim 11, wherein the first gate dielectric layer, the second gate dielectric layer, the first dielectric layer, and the second dielectric layer are patterned from a single dielectric layer disposed over the major surface of the body of semiconductor material.

13. The single level gate nonvolatile memory device of claim 11, further comprising:

a fourth well of the first conductivity type in the body of semiconductor material;

a third dielectric layer overlying the fourth well, wherein a fifth portion of the conductive layer overlies the third dielectric layer and is electrically coupled to the first portion of the conductive layer; and a third contact region in the fourth well, wherein the third contact region, the fourth well, the third dielectric layer, and the fifth portion of conductive layer form a second programming capacitor.

14. A method for accessing a single level gate nonvolatile memory device, comprising the steps of:

providing the single level gate nonvolatile memory device having a first source region, a first drain region, and a first channel region therebetween, a second source region, a second drain region, and a second channel region therebetween, a first well, and a second well formed in a semiconductor substrate, a floating gate over the semiconductor substrate and overlying the first channel region, the second channel region, the first well, and the second well, and an output terminal coupled to the first drain region and the second drain region; and programming the single level gate nonvolatile memory device by performing at least the steps of:

applying a reference voltage to a portion of the semiconductor substrate under the second channel region; and applying a programming voltage to the first well.

15. The method of claim 14, wherein the step of programming the single level gate nonvolatile memory device further includes the step of applying the reference voltage to the first source region and the second source region.

16. The method of claim 14, wherein the step of programming the single level gate nonvolatile memory device further includes the steps of:

applying the reference voltage to the second drain region; and applying a source voltage to the second source region, the source voltage being higher than the reference voltage.

17. The method of claim 14, further comprising the step of erasing the single level gate nonvolatile memory device, which includes the steps of:

applying the reference voltage to the first source region, the second source region, and the first well; and applying an erasing voltage to the second well.

18. The method of claim 17, further comprising the step of reading data from the single level gate nonvolatile memory device, which includes the steps of:

applying a first logic voltage to the first source region;

applying a second logic voltage to the second source region;

applying a reading voltage to the first well, the reading voltage being lower than the programming voltage and lower than the erasing voltage; and sensing a voltage level at the output terminal.

19. The method of claim 18, wherein the step of reading data from the single level gate nonvolatile memory device further includes the step of applying the reference voltage to the second well.

20. The method of claim 18, wherein the step of reading data from the single level gate nonvolatile memory device further includes the step of applying the reading voltage to the second well.

* * * * *